United States Patent [19]
Akimoto

[11] Patent Number: 5,361,449
[45] Date of Patent: Nov. 8, 1994

[54] CLEANING APPARATUS FOR CLEANING REVERSE SURFACE OF SEMICONDUCTOR WAFER

[75] Inventor: Masami Akimoto, Kumamoto, Japan

[73] Assignees: Tokyo Electron Limited, Tokyo; Tokyo Electron Kyushu Limited, Tosu, both of Japan

[21] Appl. No.: 130,464

[22] Filed: Oct. 1, 1993

[30] Foreign Application Priority Data

Oct. 2, 1992 [JP] Japan .................. 4-289391

[51] Int. Cl.$^5$ .................. B08B 1/00; H01L 21/304
[52] U.S. Cl. .................. 15/302; 15/309.2; 15/311; 134/149; 134/153
[58] Field of Search .......... 15/302, 309.2, 88.2, 15/310, 311; 134/149, 153

[56] References Cited

U.S. PATENT DOCUMENTS

| | | | |
|---|---|---|---|
| 4,064,885 | 12/1977 | Dussault et al. | 134/149 X |
| 4,871,417 | 10/1989 | Nishizawa et al. | 134/149 X |
| 5,169,408 | 12/1992 | Biggerstaff et al. | 134/149 X |
| 5,209,180 | 5/1993 | Shoda et al. | 134/153 X |

FOREIGN PATENT DOCUMENTS 61-9838  1/1986  Japan .
63-67243 5/1988  Japan .
4002117  1/1992  Japan .................. 134/149

Primary Examiner—Chris K. Moore
Attorney, Agent, or Firm—Oblon, Spivak, McClelland, Maier & Neustadt

[57] ABSTRACT

A cleaning apparatus for cleaning the reverse surface of a semiconductor wafer has a pair of holders for holding the wafer therebetween such that the wafer is kept substantially horizontal with the major surface directed upward. The holders can be moved close to each other and away from each other in the horizontal direction, and be moved in the vertical direction. A rotary brush is brought into contact with the reverse surface of the wafer held between the holders. The rotary brush can be rotated about its center, and be revolved substantially about the center of the wafer. The shaft of the brush is connected to a flexible pipe. Pure water as cleaning water and drying nitrogen gas of about 200° C. are selectively supplied to the reverse surface of the wafer through the flexible pipe. Cleaning nitrogen gas as a barrier gas is supplied to the major surface of the wafer so as to prevent a contaminant from being scattered from the reverse surface and attached to the major surface.

20 Claims, 4 Drawing Sheets

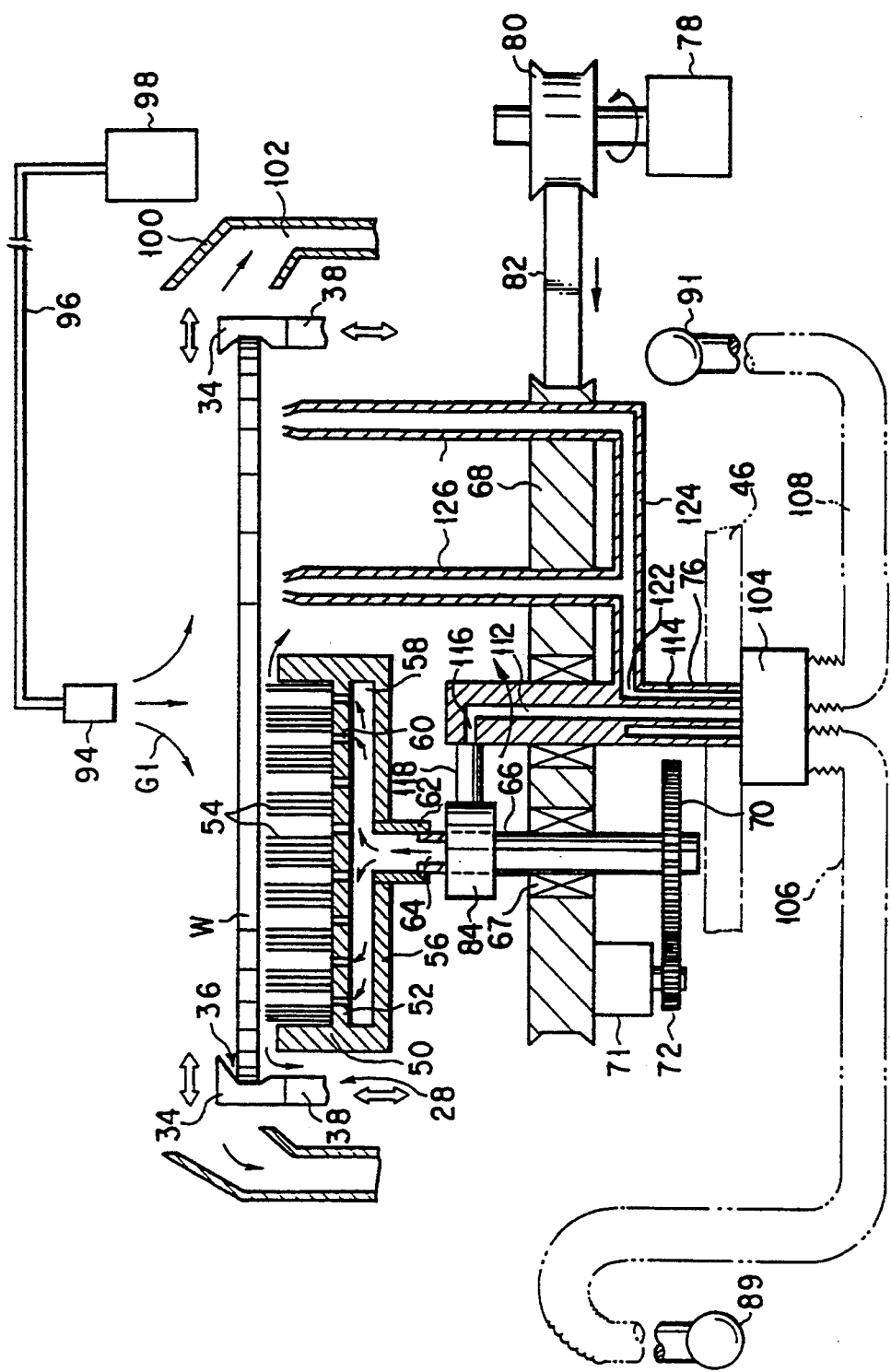
F I G. 6

5,361,449

CLEANING APPARATUS FOR CLEANING REVERSE SURFACE OF SEMICONDUCTOR WAFER

BACKGROUND OF THE INVENTION

1. Field of the Invention

This invention relates to an apparatus for cleaning the reverse surface of a semiconductor wafer opposite to the major surface thereof, and more particularly to a cleaning apparatus suitable for use in combination of a resist coating apparatus.

2. Description of the Related Art

In the process of manufacturing a semiconductor device, in general, a predetermined pattern is printed on a substrate such as a semiconductor wafer or an LCD glass substrate by the use of photolithography. For this end, a resist coating apparatus for coating a substrate with a resist, an exposure apparatus for exposing the coated substrate, a development apparatus for developing the exposed resist, etc. are used. In the treatment process using these apparatuses, contaminants such as particles, etc. must be eliminated almost completely in order to enhance the yield of products. Particles with a diameter of as small as about 1 μm, if they are attached on the reverse surface of a substrate, may cause a focus error at the time of exposure since they raise the substrate only slightly. Such adhesion of particles can occur whenever the substrate is transferred from one of the treatment apparatuses to another. Therefore, cleaning of the reverse surface of a substrate is performed by means of a cleaning apparatus to eliminate the particles.

A cleaning apparatus is generally known, which performs a treatment of brushing the reverse surface of a semiconductor wafer by means of a brush while rotating it with the major surface thereof held by vacuum attraction of a spin chuck. The brush is rotatably held by a tip end of an arm swingably provided on a side portion of the spin chuck. The reverse surface of a wafer is cleaned by applying cleaning water thereto while spinning the brush thereon, and thereafter the wafer is rotated at high speed so as to have the applied water cut and be dried.

Further, a cleaning apparatus for cleaning a wafer by applying jet water or ultrasonic wave while rotating the wafer is known, as well as the above.

The above-described cleaning apparatuses, which clean a wafer while rotating it, have the disadvantage that the spin chuck contacts the major surface of the wafer. Moreover, since each of these apparatuses employs a large rotary mechanism for rotating the spin chuck at high speed, it needs a large space. In addition, cleaning water is transformed into a mist while watercut is performed by rotating a wafer at high speed, and the mist can disadvantageously be attached to the major surface of the wafer.

SUMMARY OF THE INVENTION

It is the object of the invention to provide a cleaning apparatus capable of cleaning the reverse surface of a semiconductor wafer without spinning the wafer. Here, the "reverse surface" is the surface opposite to the major surface on which semiconductor treatments are performed to form a major region of a semiconductor device or chip. Although the semiconductor treatments include coating, exposure, and development of a resist, forming of semiconductor films or oxide films, and etching, etc., only the treatments to a resist will be referred to in the embodiments described hereinbelow.

According to the present invention there is provided a cleaning apparatus for cleaning a reverse surface of a semiconductor wafer reverse to a major surface thereof to be subjected to semiconductor treatments, comprising: a pair of holders for holding the wafer therebetween such that the wafer is kept substantially horizontal with the major surface directed upward; holder driving means for moving the holders close to each other and away from each other in a horizontal direction; first supply means for supplying cleaning liquid to the reverse surface of the wafer held by the holders; washing means for removing, with the use of the cleaning liquid, a contaminant from the reverse surface of the wafer held by the holders; and second supply means for supplying a drying gas to the reverse surface of the wafer held by the holders.

Additional objects and advantages of the invention will be set forth in the description which follows and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a cross sectional view, showing an essential part of a cleaning apparatus according to a second embodiment of the invention.

DETAILED DESCRIPTION OF THE PREFERRED EMBODIMENTS

Figure 2:
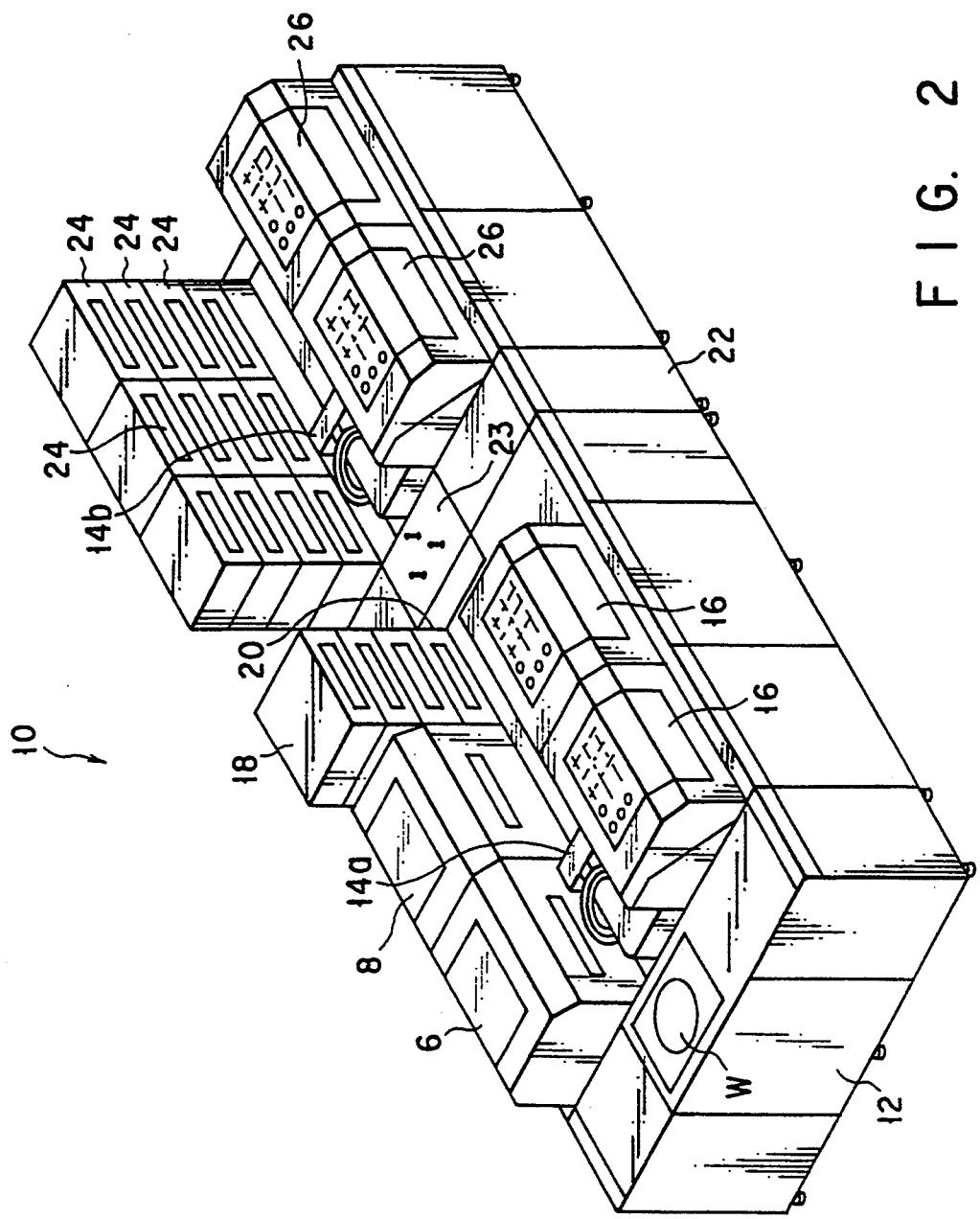
FIG. 2 is a perspective view, showing a treatment system in which the cleaning apparatus is located.

As is shown in FIG. 2, a treatment system 10 according to the invention has, on one side thereof, a carrier station 12 for containing a plurality of cassettes (not shown) each for receiving a plurality of 8-inch semiconductor wafers W. In the carrier station 12, a semiconductor wafer can be taken out and into each cassette by means of the transfer arm 15 of a transfer member 14a, hereinafter referred to.

Two transfer members 14a and 14b are provided in a central portion of the system 10 such that they can be moved in the longitudinal direction so as to transfer each wafer. Various treatment apparatuses contained in respective casings, such as a resist coating apparatus (hereinafter referred to), etc., are located along the both sides of the transfer path of wafers. These treatment apparatuses are sorted into two groups connected to each other by means of a connecting unit 22. A relay table 23 is provided on the connecting unit 22 for passing each wafer between the transfer members 14a and 14b.

Two resist coating apparatuses 16 and two cleaning apparatuses 6 and 8 are located within the operation range of the transfer member 14a, facing one another with the transfer path interposed therebetween. Each of the resist coating apparatuses 16 coats the major surface of a wafer W with a resist. The apparatus 16 has a structure as disclosed in copending U.S. patent application Ser. No. 07/755,781 filed on Sep. 6, 1991, the teaching of which are hereby incorporated by reference. The cleaning apparatus 6 cleans the major surface of each wafer. The cleaning apparatus 8, which accords to the first embodiment of the invention, cleans the reverse surface of each wafer. Further, an adhesion apparatus 18 and a cooling apparatus 20 are stacked on each other and located adjacent to the cleaning apparatus 8. The adhesion apparatus 18 imparts the major surface of each wafer with hydrophobic properties.

Within the operation range of the transfer member 14b, a plurality of heating apparatuses 24 and two development apparatuses 26 are arranged with the transfer path interposed therebetween. The heating apparatuses 24 consist, for example, of hot plate ovens, and are arranged in the horizontal and vertical directions. The development apparatuses 26 develop a resist layer formed on each wafer and exposed with a photolithographic light.

Moreover, an exposure apparatus (not shown) is provided on the side of the treatment system 10 close to the heating apparatuses 24 and the development apparatuses 26, for exposing a resist layer to form a predetermined fine pattern.

Figure 1:
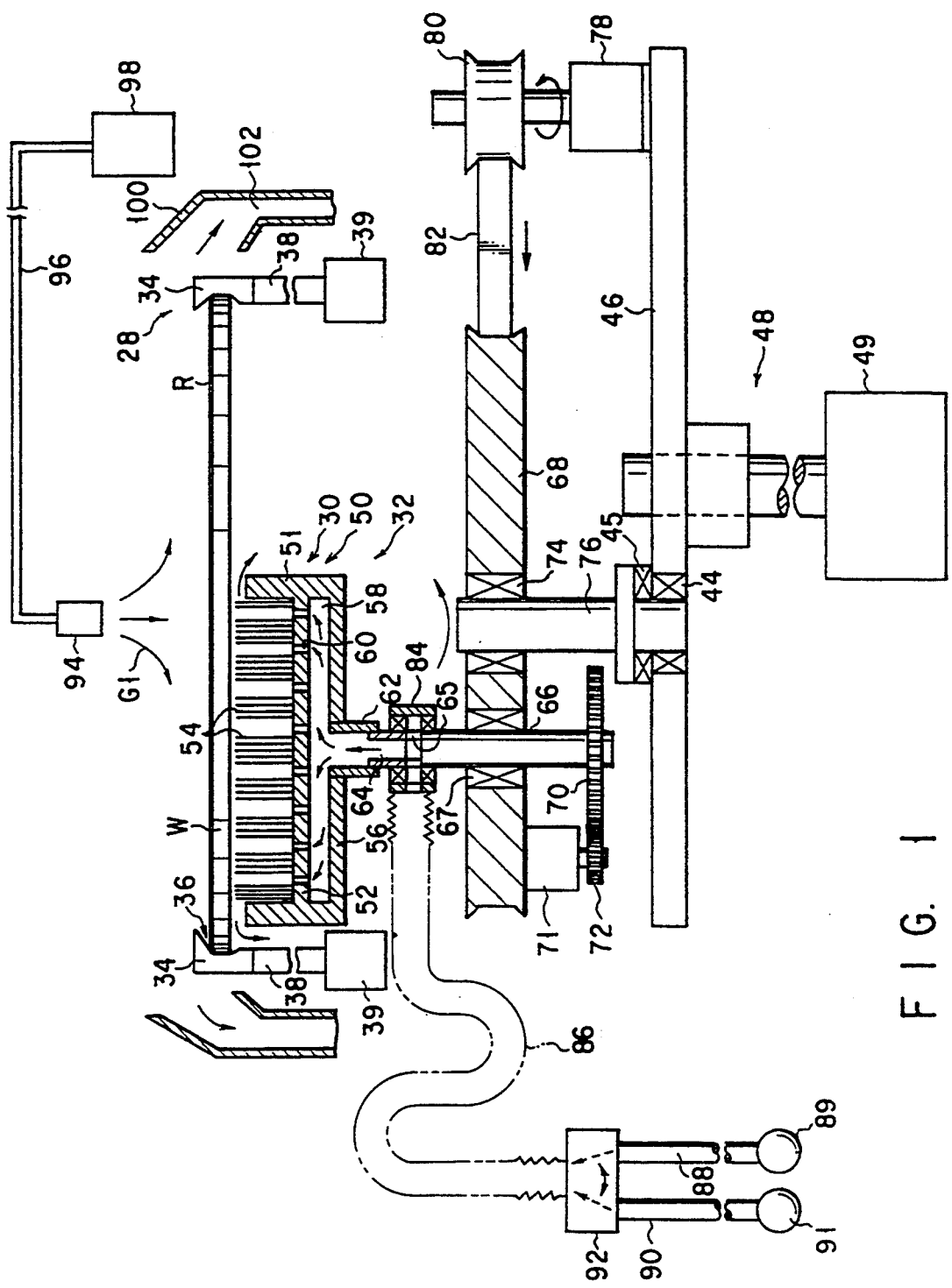
FIG. 1 is a cross sectional view, showing an essential part of a cleaning apparatus according to a first embodiment of the invention.

FIG. 1 is a schematic view of the cleaning apparatus 8 according to the first embodiment of the invention, which is constructed as above and incorporated in the treatment system 10. In FIG. 1, the casing of the apparatus 8 shown in FIG. 2 is omitted. The apparatus 8 comprises substrate holding means 28 for holding an edge portion of the semiconductor wafer W as a substrate to be treated, and cleaning means 30 and drying means 32 which serve to clean the reverse surface of the wafer W and also to dry the cleaned surface, respectively. In the first embodiment, the cleaning means 30 and dry means 32 commonly own a flow passage.

The holding means 28 has a pair of holders 34 located symmetrical with respect to the center of the wafer W, and to be engaged with edge portions of the wafer W. Each holder 34 has an arcuate shape corresponding to an edge portion of the wafer W, and has a width of 10–60 mm. Each holder 34 is made of a synthetic resin such as teflon or a ceramic. Substantially V-shaped grooves 36 opening in the horizontal and inward direction are formed in the holders 34, respectively, and face each other. The wafer W is held by the holding means 28, with the edge portions engaged with the grooves 36 of the holders 34. In this state, the wafer W is positioned substantially horizontal with its major surface directed upward. The holders 34 are attached to the upper ends of movable elements BS. The movable elements 38 can be moved in the horizontal direction by means of a driving mechanism 39 such that they come close to each other and go away from each other, and also can be moved in the vertical direction. The holders 34 may not have such grooves, but be constructed such that they can be brought into direct contact with the wafer W.

Figure 3:
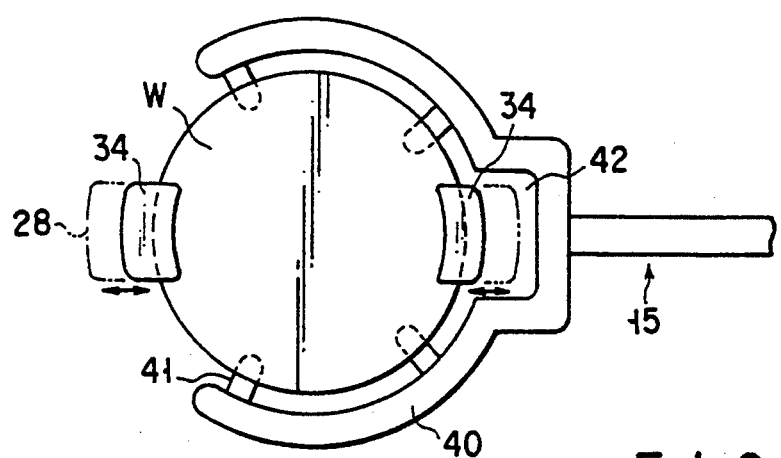
FIG. 3 is a plan view, showing wafer holding means employed in the cleaning apparatus.

As is shown in FIG. 3, the tip of the wafer-handling arm 15 of each of the transfer members 14a and 14b is provided with a ring frame 40. The ring frame 40 has a depression 42 at that part which is connected to the arm 15, for allowing the holder 34 to move in the horizontal and vertical directions. Four pins 41 made of teflon or ceramic project from the inner surface of the frame 40, and can be brought into contact with peripheral portions of the reverse surface of the wafer W.

The cleaning means 30 has a rotary brush 50. The brush has a bundle of brush hair 54 with a diameter smaller than the diameter of the wafer W (when the diameter of the wafer is 8 inches, the diameter of the brush hair bundle may be about 100 mm or more). Specifically, the brush 50 has a cylindrical frame 51 and a dispersing plate 52 provided in the frame. On the plate 52, brush hair 54 made of nylon stands vertical and projects from the upper end of the frame 51, for example, by 2–5 mm.

A space 58 defined between the dispersing plate 52 and the bottom 56 of the fame 51 functions as a cleaning header 58. A plurality of holes 60 are formed in the dispersing plate 52, through which cleaning water is discharged upward of the brush 50 from below.

A cleaning water inlet 62 is formed in a central portion of the bottom 56 of the frame 51, and is connected to a shaft 66 which defines therein an axial bore 64 at its top. The center of the shaft 66 is substantially aligned with the center of the hair bundle 54 or the brush 50. The shaft 66 is rotatably supported by a bearing 67 in an off-center position of a large-diameter pulley, i.e., a disk 68. A driving motor 71 is attached to the lower surface of the disk 68. The output shaft of the motor 71 is coupled with a gear 72 engaged with a gear 70 fixed to the shaft 66. Thus, the motor 71 can rotate the brush 50 about the shaft 66.

Figure 4:
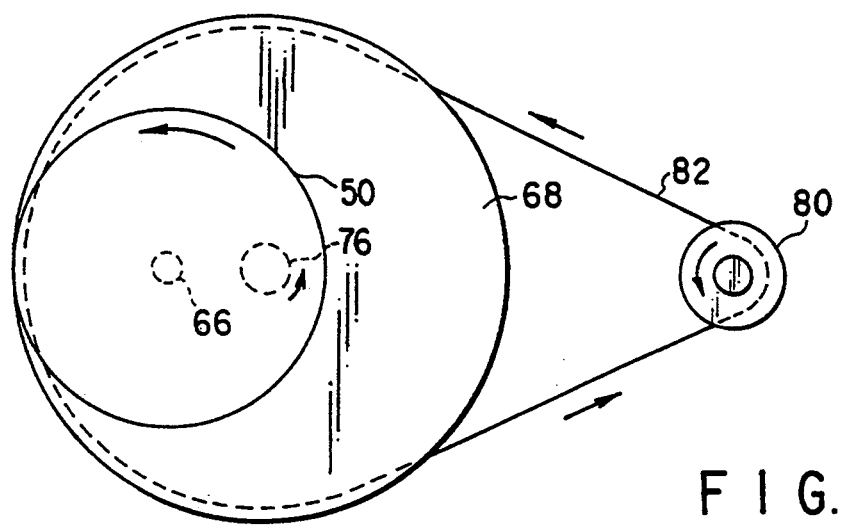
FIG. 4 is a plan view, showing a driving mechanism of a cleaning brush employed in the cleaning apparatus.

The center of the disk 68 is supported by means of a shaft 76 via a bearing 74 such that the disk can rotate about the shaft 76. The center of the shaft 76 is substantially aligned with the center of the wafer W. A motor 78 is located adjacent to the disk 68, and has its output shaft fixed to a small-diameter pulley 80. As is clearly shown in FIG. 4, the small-diameter pulley 80 is connected to the disk or large-diameter pulley 68 by means of an endless belt 82. Thus, the motor 78 rotates the disk 68 and accordingly revolves the brush 50 about the shaft 76. In summary, the brush 50 is rotated about its center by the motor 71 and revolved by the motor 78 substantially about the center of the wafer W, with the result that the brush 50 cleans the reverse surface of the wafer W. The diameter of the brush 50 and the revolution diameter thereof are set so that the brush hair 54 can cover the overall reverse surface of the wafer W except for a narrow edge portion of the wafer W.

The lower ends of the shaft 76 is rotatably supported by a support plate 46 via a radial bearing 44 and a thrust bearing 45. The motor 78 is fixed to the support plate 46. The plate 46 can be moved in the vertical direction by means of an elevator 48 provided with a motor 49. Thus, the brush 50 is movable in the vertical direction, i.e., can move toward and away from the reverse surface of the wafer W, together with the rotary mechanism.

Two radial holes 65 are formed in the shaft 66 to communicate with the bottom portion of the axial bore 64. A joint 84 is attached to the shaft 66 to surround the holes 65 and to be rotatable in an airtight manner in relation to the shaft 66. A flexible tube 86 is connected at its one end to the side of the joint 84 such that the tube 86 communicates with the axial bore 64. The other end of the tube 86 is connected to a three-way valve 92 which can connect the tube 86 to a cleaning water-supply pipe 88 and a drying gas-supply pipe 90. Cleaning water such as pure water and drying gas such as nitrogen gas of about 200° C. or clean air can be selectively supplied by switching the three-way valve 92. Thus, in the first embodiment, the cleaning means 30 and drying means 32 commonly own the passage formed between the valve 92 and brush 50.

The pipe 88 is connected to a cleaning water source 89, while the pipe 90 is connected to a drying gas source 91 with heating means. Further, a gas nozzle 94 is provided above the brush 50, i.e., above the center of the wafer W, for supplying a barrier gas such as clean $N_2$ gas or clean air. The nozzle 94 is connected to a clean gas source 98 via a gas supply pipe. The barrier gas blown through the nozzle 94 during cleaning prevents the major surface of a wafer from being contaminated by a cleaning water mist scattered from the reverse surface of the wafer.

A ring-shaped exhaust port 100 opens around the wafer W, and is connected to an exhaust duct 102.

The operation of the overall treatment system will now be explained.

First, the wafer W is transferred from the carrier station 12 into the cleaning apparatus 6 by the transfer member 14a. The apparatus 6 cleans the major surface of the wafer W. Thereafter, the water W has its reverse surface brushed and dried in the cleaning apparatus 8. The dried wafer W is treated in the adhesion apparatus 18 so as to have hydrophobic properties, and is cooled in the cooling apparatus 20. Subsequently, the wafer W is transferred into the resist coating apparatus 16, where the major surface of the wafer is coated with a photoresist. The wafer W with a resist layer is prebaked in the heating apparatus 24.

Thereafter, a predetermined pattern is printed on the resist layer of the wafer W by means of an exposure apparatus (not shown). The exposed wafer W is received in the development apparatus 26, where the resist layer is developed by the use of a developer, and then rinsed. Then, the wafer W is again transferred into the heating apparatus 24, and subjected to a baking treatment.

Further, the wafer W with the patterned resist layer (denoted by reference sign R in FIG. 1) on the major surface has its reverse surface cleaned in the cleaning apparatus 8. Thereafter, the wafer W received in a cassette in the carrier station 12, and is again transferred therefrom to be treated in the next treatment process.

The above-described treatment process is only an example, and cleaning of the reverse surface of the wafer can be performed whenever this treatment is necessary.

The cleaning operation of the cleaning apparatus 8 will be explained in detail. When the wafer W has been transferred by the transfer member 14a into the cleaning apparatus 8, the holders 34 are moved toward the wafer W from below, and approach each other in the horizontal direction. Then the wafer W is held between the holders 34, with its major surface directed upward and kept substantially horizontal, and the transfer member 14a is retreated.

Figure 5:
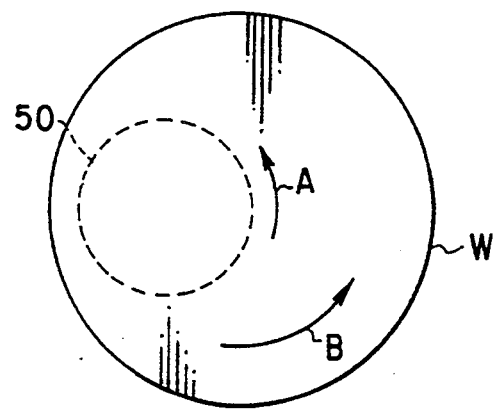
FIG. 5 is a plan view, useful in explaining the operation of the cleaning brush on a wafer.

Then, the brush 50 is moved upward so that a tip portion of the brush hair bundle 54 is brought into contact with the reverse surface of the wafer W. The motors 71 and 78 are driven to rotate the brush 50 about its center and revolve the same about the center of the wafer W, thereby brushing the reverse surface. In FIG. 5, the direction of the rotation is indicated by the arrow A, and that of the revolution by the arrow B. In accordance with the movement of the brush 50, the three-way valve 92 is switched to open the pipe 88 and supply cleaning water to the cleaning header 58, defined at a lower portion of the frame 51, through the flexible tube 86, and the bore 64 in the shaft 66. The cleaning water flows into an upper portion of the frame 51 through the holes 60 of the dispersing plate 52, and is discharged onto the reverse surface of the wafer W from the tip portion of the brush hair bundle 54.

As described above, while rotating and revolving, the brush 50 removes contaminants such as particles from the reverse surface of the wafer W by the use of the cleaning water. While being brushed, the wafer W is fixed. For example, the amount of the cleaning water is set to about 2 l/min., and cleaning is performed for about 30 seconds.

Further, while cleaning is performed, the gas nozzle 94 located above the center of the wafer W spouts, against the wafer W, a cleaning gas Gl such as nitrogen gas or clean air of a room temperature. This prevents adhesion onto the wafer W of a cleaning water mist arising during cleaning.

After cleaning is performed for a predetermined time, the brush 50 is slightly moved away from the reverse surface of the wafer W, and at the same time the three-way valve is switched to close the cleaning water supply pipe 88 and open the drying gas supply pipe 90. As a result, a drying gas such as nitrogen gas or clean air of a predetermined temperature of e.g. 200° C. is blown against the reverse surface of the wafer W. The drying gas may be supplied after the cleaning water is exhausted from the frame 51, the shaft 66, the flexible tube 86, etc.

This drying gas is blown against the reverse surface of the wafer W from the brush 50 through the same line of the cleaning water, thereby drying the reverse surface. As a result, the speed of drying wafers increases, and accordingly the throughput of the process increases. While the drying gas is supplied, the disk 68 must be rotated to continue revolution of the brush 50, although rotation thereof may be stopped. The amount and temperature of the drying gas, and the time period for which the gas is supplied are set so that the reverse surface of the wafer W can be sufficiently dried.

As described above, in the first embodiment, edge portions of a wafer are held by the holders 34, which dispenses with such means for holding the major surface of a wafer as employed in the conventional spin chuck. Thus, the invention is free from a bad influence on the major surface of a wafer. Further, since a wafer is fixed while it is cleaned, a large rotary mechanism such as the conventional spin chuck is not necessary, and therefore the required installation space can be reduced. Moreover, since a wafer itself is not rotated, the amount of a mist arising during cleaning can be greatly reduced, and the degree of contamination of the major surface of the wafer can be minimized.

FIG. 6 shows a cleaning apparatus according to a second embodiment of the invention. In FIG. 6, elements corresponding to those shown in FIG. 1 are denoted by the same reference numerals, and an explanation will be omitted.

In the second embodiment, cleaning water and drying gas are supplied through different lines. Specifically, cleaning water is supplied through the flexible tube 106, and drying gas through the flexible tube 108.

At the bottom of the shaft 76, a joint 104 is attached thereto such that the shaft 76 is rotatable in an airtight manner in relation to the joint 104. Two axial bores 112 and 114 are formed in the shaft 76 and arranged coaxially. The flexible tubes 106 and 108 are connected to the joint 84 such that they communicate with the bores 112 and 114, respectively.

The inner bore 112 is connected through a port 116 to a pipe 118, which is fixed to the shaft 76 at its upper portion. The pipe 118 is on the other hand connected to the shaft 66 via the joint 84, which has substantially the same structure as the joint 84 shown in FIG. 1. In other words, the inner bore 112 of the shaft 76 communicates with the header 58 of the brush 50, and is used for supplying cleaning water.

The outer bore 114 of the shaft 76 is connected through a port 122 to a branch pipe 124, which is fixed to the shaft 76 and has two projecting pipes 126. The pipes 126 extend through the disk 68, and are supported by the disk 68 such that their tip portions are located near the wafer W. The tip portion of each projecting pipe 126 is tapered so that the flow speed of the drying gas can increase, i.e., the tip portion can functions as a nozzle for spouting the gas.

The second embodiment can provide an advantage similar to that obtained in the first embodiment. Further, although the second embodiment has a little more complicated structure than the first embodiment, the former has the advantage that the cleaning wafer and the drying gas can be switched more easily than the latter.

Although in the first and second embodiments, the motor 71 is used to rotate the brush 50 about its center, this structure may be modified such that a gear engaged with the gear 70 is fixed at the center of the disk 68, so as to rotate the brush 50 about its center in accordance with rotation of the disk 68. Moreover, the brush 50 may be rotated about its center by the use of the hydraulic energy of cleaning water or drying gas generated by torque generation means (e.g. a screw) located in the passage of the cleaning water or the drying gas. In addition, a supersonic wave cleaning mechanism or a jet water cleaning mechanism, which has a jet nozzle with a variable elevation angle or a plurality of nozzles capable of covering the overall reverse surface of a wafer, may be used as cleaning means 30, as well as the brush 50 or in place of the brush 50.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A cleaning apparatus for cleaning a reverse surface of a semiconductor wafer reverse to a major surface thereof to be subjected to semiconductor treatments, comprising:

a pair of holders for holding the wafer therebetween such that the wafer is kept substantially horizontal with the major surface directed upward;

holder driving means for moving the holders close to each other and away from each other in a horizontal direction;

first supply means for supplying cleaning liquid to the reverse surface of the wafer held by the holders;

washing means for removing, with the use of the cleaning liquid, a contaminant from the reverse surface of the wafer held by the holders; and second supply means for supplying a drying gas to the reverse surface of the wafer held by the holders.

2. The cleaning apparatus according to claim 1, wherein the washing means comprises a brush to be brought into contact with the reverse surface of the wafer to brush the same, first driving means for rotating the brush about a rotation center of itself, and second driving means for moving the brush on the reverse surface of the wafer in a state where the brush is rotated about the rotation center.

3. The cleaning apparatus according to claim 2, wherein the second driving means revolves the brush substantially about a center of the wafer.

4. The cleaning apparatus according to claim 3, further comprising means for moving the brush, in the vertical direction, close to and away from the reverse surface of the wafer held by the holders.

5. The cleaning apparatus according to claim 4, wherein the brush-moving means moves the brush, together with the first and second driving means.

6. The cleaning apparatus according to claim 5, further comprising third supply means for supplying a barrier gas capable of preventing the major surface of the wafer from receiving a contaminant scattered from the reverse surface of the wafer during cleaning of the reverse surface.

7. The cleaning apparatus according to claim 6, wherein the first driving means has a first shaft connected to a lower portion of a frame of the brush, and the second driving means has a rotary plate supporting the first shaft n an off-center position of the rotary plate, and a second shaft supporting the rotary plate, the center of the second shaft being substantially aligned with the center of the wafer.

8. The cleaning apparatus according to claim 7, wherein the first supply means comprises an axial bore formed in the frame of the brush and in the first shaft, and the axial bore communicates with a cleaning liquid source.

9. The cleaning apparatus according to claim 8, wherein the frame of the brush is formed as a vessel, and has a bottom plate connected to the first shaft, and a dispersing plate located within the frame separate from the bottom plate, and having a plurality of holes, a space defined between the bottom plate and the dispersing plate functioning as a cleaning header.

10. The cleaning apparatus according to claim 9, wherein the axial bore and the cleaning header function also as part of the second supply means for supplying the drying gas.

11. The cleaning apparatus according to claim 9, wherein the second supply means comprises a drying gas nozzle directed to the reverse surface of the wafer and arranged to be revolved substantially about the center of the wafer along with the brush, and the drying gas nozzle communicates with a drying gas source.

12. The cleaning apparatus according to claim 9, further comprising holder elevating means for moving the holders in a vertical direction.

13. The cleaning apparatus according to claim 9, further comprising an exhaustion port surrounding the wafer held by the holders, and an exhaustion duct connected to the exhaustion port.

14. A resist coating system for coating a major surface of a semiconductor wafer with a resist, and cleaning a reverse surface of the wafer reverse to the major surface, comprising:
  (a) a resist coating apparatus for coating the major surface of the wafer with a resist;
  (b) a cleaning apparatus for cleaning the reverse surface of the wafer, including:
    a pair of holders for holding the wafer therebetween such that the wafer is kept substantially horizontal with the major surface directed upward;
    holder driving means for moving the holders close to each other and away from each other in a horizontal direction;
    first supply means for supplying cleaning liquid to the reverse surface of the wafer held by the holders;
    washing means for removing, with the use of the cleaning liquid, a contaminant from the reverse surface of the wafer held by the holders; and
    second supply means for supplying a drying gas to the reverse surface of the wafer held by the holders; and
  (c) transfer means for transferring the wafer between the coating apparatus and the cleaning apparatus.

15. The system according to claim 14, wherein the transfer means includes a transfer arm which moves without interfering horizontal movement of the holders.

16. The cleaning apparatus according to claim 15, wherein the washing means comprises a brush to be brought into contact with the reverse surface of the wafer to brush the same, first driving means for rotating the brush about a rotation center of itself, and second driving means for moving the brush on the reverse surface of the wafer in a state where the brush is rotated about the rotation center.

17. The cleaning apparatus according to claim 16, wherein the second driving means revolves the brush substantially about a center of the wafer.

18. The cleaning apparatus according to claim 17, further comprising means for moving the brush, in the vertical direction, close to and away from the reverse surface of the wafer held by the holders.

19. The cleaning apparatus according to claim 18, wherein the brush-moving means moves the brush, together with the first and second driving means.

20. The cleaning apparatus according to claim 19, further comprising third supply means for supplying a barrier gas capable of preventing the major surface of the wafer from receiving a contaminant scattered from the reverse surface of the wafer during cleaning of the reverse surface.

* * * * *